United States Patent [19]

Zemek et al.

[11] Patent Number: 4,625,399

[45] Date of Patent: Dec. 2, 1986

[54] METHOD AND APPARATUS FOR INSERTING LEADS OF ELECTRICAL COMPONENTS INTO CORRESPONDING HOLES ACCORDING TO DIFFERENT SPACINGS OF SAID HOLES

[75] Inventors: Albert W. Zemek, Windsor; Frank J. Orzelek, Binghamton; Charles Dunlap, Kirkwood, all of N.Y.

[73] Assignee: Universal Instruments Corporation, Binghamton, N.Y.

[21] Appl. No.: 593,929

[22] Filed: Mar. 27, 1984

[51] Int. Cl.⁴ .......................... H05K 3/32; B23P 19/00
[52] U.S. Cl. ......................................... 29/845; 29/741; 227/90
[58] Field of Search .................. 29/834, 845, 741, 842; 227/109, 90, 79

[56] References Cited

U.S. PATENT DOCUMENTS

| | | | |
|---|---|---|---|
| 3,167,780 | 2/1965 | Mueller | 227/90 X |
| 3,593,404 | 7/1971 | Ragard | 227/79 |
| 3,594,887 | 7/1971 | Clark | 227/90 |
| 4,417,683 | 11/1983 | Lewis et al. | 227/109 |
| 4,470,182 | 9/1984 | Zemex et al. | 227/90 X |

Primary Examiner—Howard N. Goldberg
Assistant Examiner—Carl J. Arbes
Attorney, Agent, or Firm—Fidelman, Wolffe, & Waldron

[57] ABSTRACT

A method and apparatus are disclosed for adapting a variable center distance electronic component insertion machine to form and insert the leads of components into particularly closed spaced mounting holes of a circuit board.

12 Claims, 12 Drawing Figures

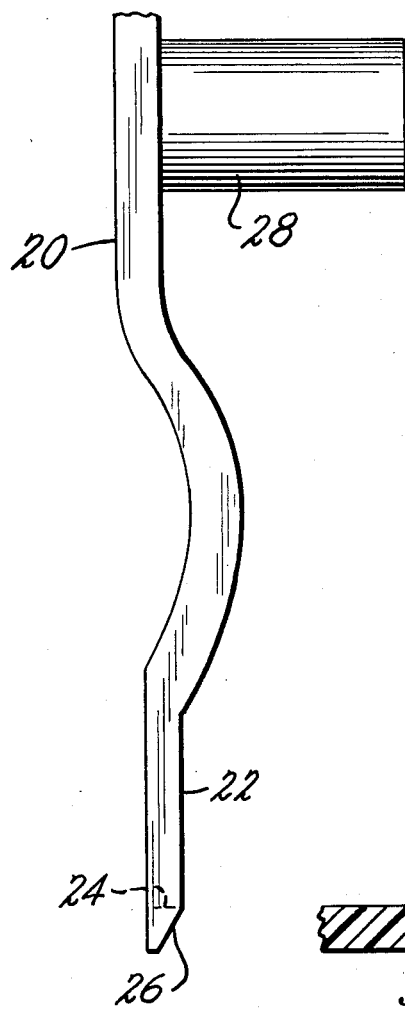
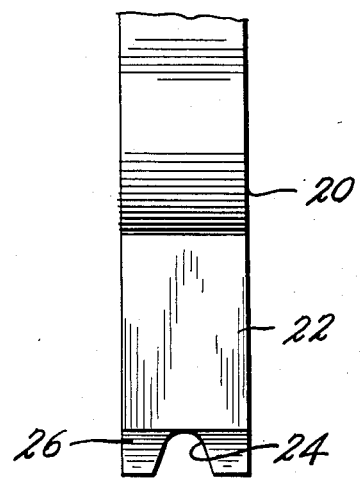
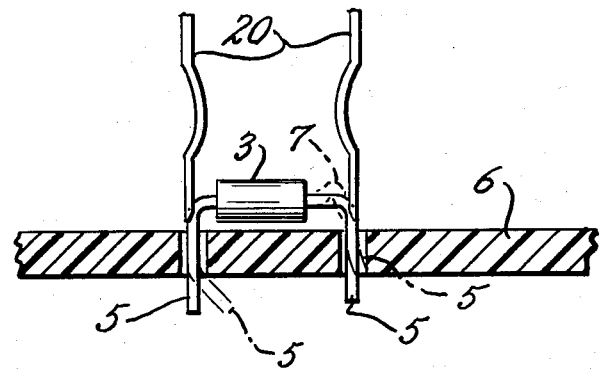

METHOD AND APPARATUS FOR INSERTING LEADS OF ELECTRICAL COMPONENTS INTO CORRESPONDING HOLES ACCORDING TO DIFFERENT SPACINGS OF SAID HOLES

CROSS-REFERENCES TO PRIOR ART

U.S. Pat. No. Re. 27,968—Ragard, et al. Multisize Variable Center Electronic Component Insertion Machine, reissued Apr. 9, 1974.

U.S. Pat. No. 3,796,363—Ragard Multiple Component Insertion Apparatus, issued Mar. 12, 1974.

BACKGROUND AND SUMMARY OF THE INVENTION

The present invention is directed toward an improved method and apparatus for insertion of the leads of electronic components into the corresponding holes of a circuit board, wherein an insertion tooling is automatically adjustable to accommodate axial lead components having body portions of varying lengths and wherein this tooling is "lead driving", i.e., drivingly engages the leads rather than the bodies of the components. In particular, the improvement is directed to adaptation of these insertion heads to such component mountings via corresponding circuit board holes which are much more closely spaced than prior art variable spacing "lead driving" insert tooling has been able to handle. Still more particularly, the invention is directed to insertion of axial lead electronic components into spaced holes of a circuit board wherein the center-to-center spacings of the holes are 5 mm. and greater.

Prior art variable center distance machines like those cross-referenced above have not been adaptable to insertion of components into 5 mm. center-to-center hole spacings by lead driving without changing the driver blades for such insertions. Particularly, the prior art insertion apparatus for 5 mm. center-to-center hole spacings has employed tooling which drivingly engages the body of the component or fixed insertion heads, wherein the component lead severing, bending and driving tools incorporated within the insertion head are not relatively adjustable, i.e., such devices have been dedicated to 5 mm. insertion. Hence, an additional insertion head was required for "lead driving" insertion into 5 mm. hole spacings along with larger hole spacings in the same circuit board.

Accordingly, a primary object of the present invention is to provide a "lead driving" insertion method and apparatus which overcomes the above-mentioned necessity for an insertion head dedicated to 5 mm. hole spacings.

It is a further object to provide a method and apparatus for opening and closing insertion tooling relative to a mid-plane in order to accommodate insertion of component leads into circuit board mounting holes of different center distances, while providing closer spacing of the tooling drivers for closer hole spacings such that cooperative structural configurations between the lead drivers and lead formers provides automatic adjustment of the spacing between drivers.

According to the present invention, there is provided an insertion head having a pair of tooling sections which are adjustable, by spreading or closing relative to a midplane, so as to permit a component to be inserted into a board on any desired lead center or center distance (C.D.). The ability of the same insertion head to insert on variable lead centers permits versatility of circuit board design and terminal arrangement, while providing maximum circuit board population density. Still greater density and versatility may be realized by use of the invention to make insertions in 5 mm. hole spacings. In order to provide driver blades similar to those disclosed in the above cross-referenced U.S. Pat. No. Re. 27,968, which will allow closing of the spaced tooling sections sufficiently to handle components having body lengths of 0.150 inches for "lead driving" insertion into 5 mm. hole spacings, it is necessary to reduce the thickness of the driver blades. However, in attempting to mount components on the circuit board via larger hole spacings while using thinner driver blades, misinsertions of particular leads can and do occur during a subsequent clinching operation by kicking an inserted lead out from under the reduced thickness of the driver blade. The instant invention overcomes such difficulties by spacing the driver blades of reduced thickness from the outside formers of such insertion heads when handling insertions in greater hole spacings. In this manner, a reduced thickness blade does not ride upon the radius of a formed lead sufficiently to lose control of such a lead during the subsequent clinching operation.

BRIEF DESCRIPTION OF THE DRAWINGS

FIGS. 6 and 7 are enlargements of the tip of the driver blade of the instant invention, in order to illustrate details thereof.

FIG. 8 is an enlarged fragmentary view illustrating a lead misinsertion which can occur when not practicing the instant invention.

DETAILED DESCRIPTION OF THE INVENTION

Figure 1A:
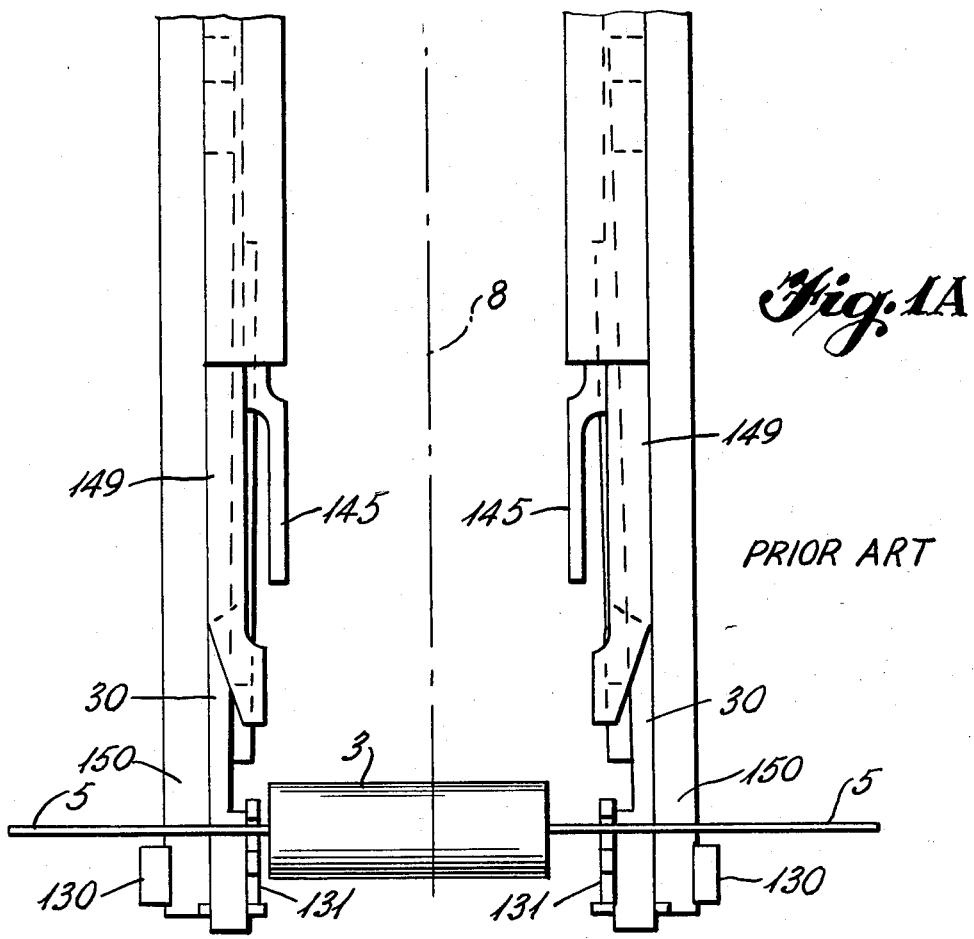
FIGS. 1A–1C are front elevations illustrating prior art variable center distance insertion tooling.
Figure 1B:
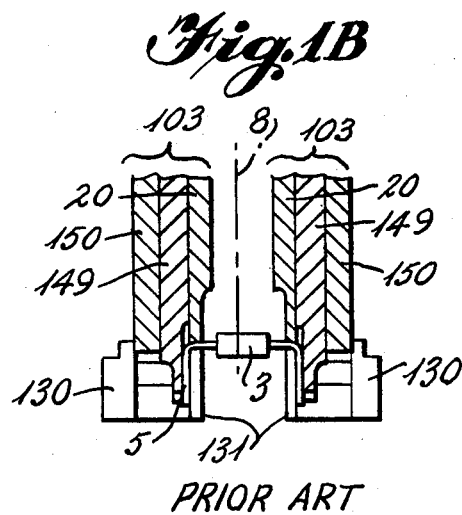
Figure 1C:
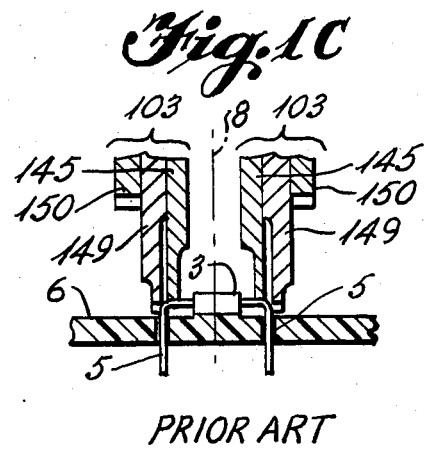
Figure 2:
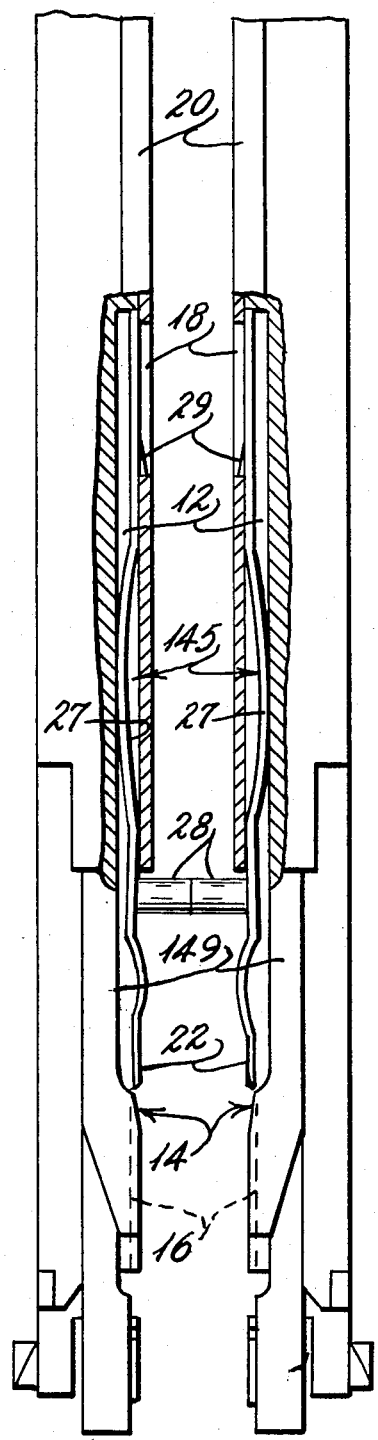
FIGS. 2 and 3 are front elevational views illustrating one-half of an improved insertion tooling structure over the prior art.
Figure 3:
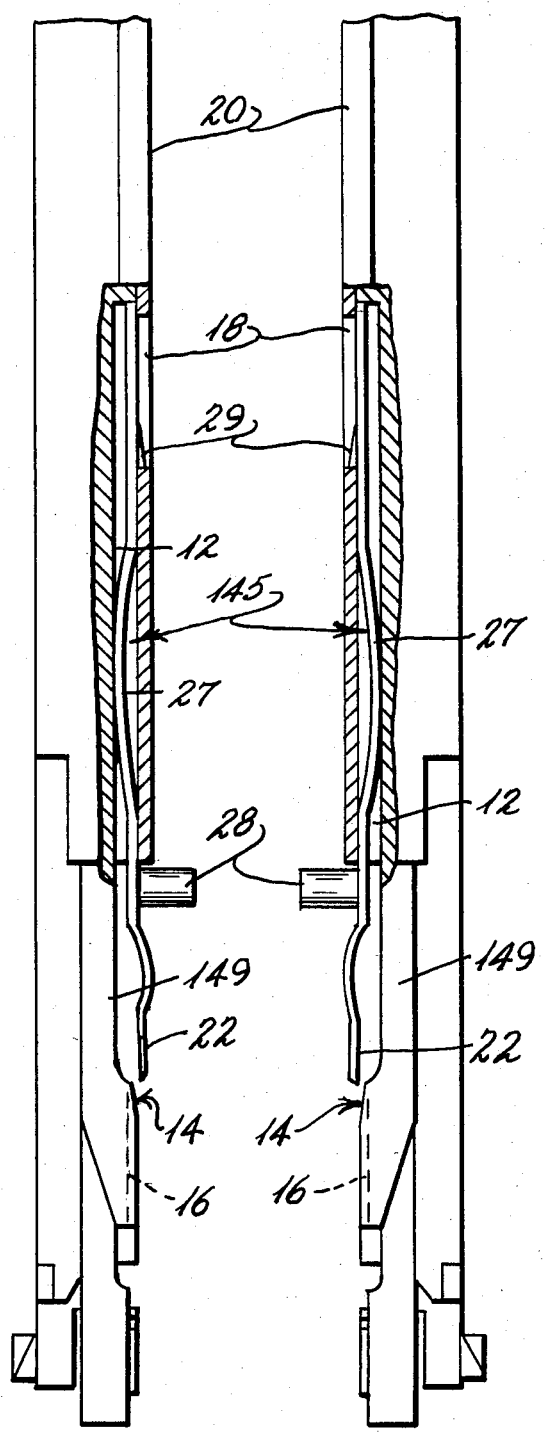
Figure 4:
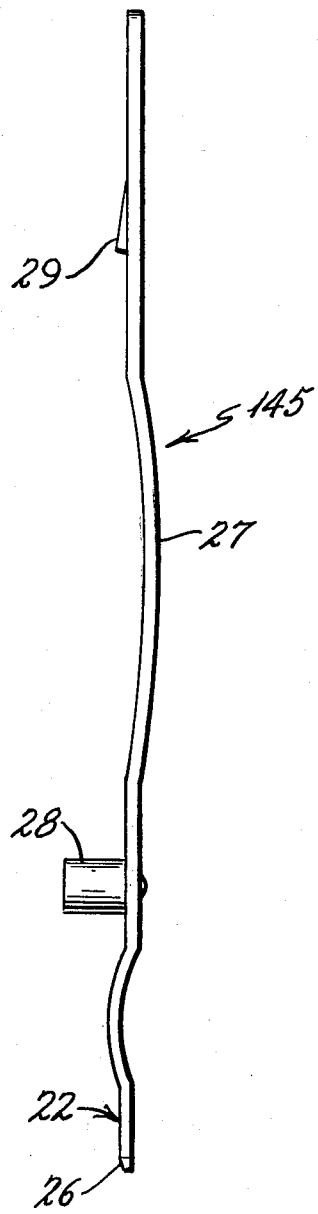
FIG. 4 is a front elevational view of a single, replaceable driver blade of the instant invention.
Figure 5:
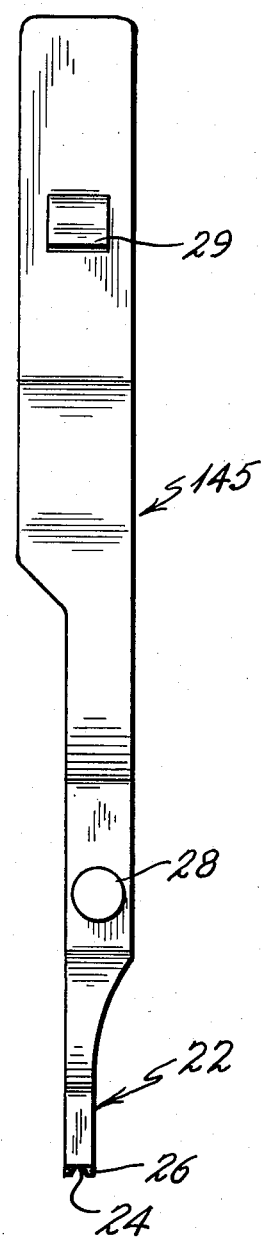
FIG. 5 is a left side elevation of the device of FIG. 4.
Figure 9:
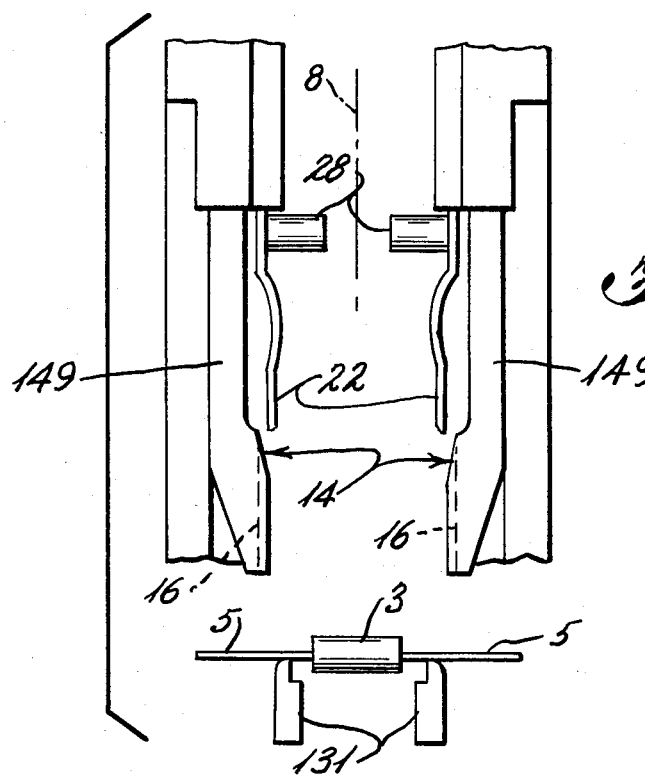
FIGS. 9 and 10 are enlarged fragmentary views illustrating handling of a component for insertion into 5 mm. hole spacing.

Referring to FIGS. 1A–1C, prior art machines to which the instant invention is particularly applicable include insertion tooling sections 103 which are variable movable in directions perpendicular to a mid-plane 8 in order to adjust to various lengths of component bodies 3 prior to trimming and forming leads 5 for subsequent insertion into the holes of circuit board 6. Each tooling section 103 includes an outside former 149, an inside former 131, and driver blades 145, with relative vertical movement between inside formers 131 and outside formers 149 forming the leads 5 for subsequent insertion into the holes of circuit board 6 by driving engagement of drivers 145, as is clearly discernible from these drawings and the above cross-referenced patents.

The instant invention is directed to a method and apparatus by which variable tooling sections of the lead driving type are able to handle components and insert the leads thereof into circuit board holes which have centerto-center spacings typically 0.197–0.800 inches in range. It is important to keep in mind that, typically, the component has a maximum body length of 0.150 inches, and a maximum lead diameter of 0.020 inches for insertion into minimum hole diameters on the order of 0.040 inches. Further, since the leads 5 must be formed or bent sufficiently close to body 3 for subsequent insertion into the 5 mm. hole spacings, there is a physical limit to the thickness that each driver 145 may be in order to pass between an end of body 3 and the corresponding outside former 149 without crushing body 3 during such insertion. For larger hole spacings, the thickness of driver blade 145 is not as critical. However, when using a driver blade of sufficiently reduced thickness, i.e., 0.020 inches, a problem arises upon spreading of tool sections 103 that the reduced thickness driver blade 145 is engaging each lead 5 at substantially the formed radius thereof without being limited inwardly by body 3, so that during a subsequent clinching operation (by an apparatus illustrated in phantom lines in FIG. 1C) a lead may be forced or kicked out from under driving engagement with a driver. Such a lead misinsertion is illustrated by phantom lined lead 7 in FIG. 8.

By the instant invention, the above noted problems are overcome by providing driver blades 145 sufficiently thin as to handle components for insertion into 5 mm. hole spacings, while particularly adapting such thin driver blades to provide insertion of components into the larger hole spacings up to about 0.800 inches, without loss of control of the leads by the driver blades as by "kick-out" during a subsequent clinching operation. Such provision has been accomplished by providing a blade 145 of blue spring steel which is configured for removable mounting within a slot 12 of each driver body 20 and is held therein by engagement of latch portion 29 of blade 145 within orifice 18 of the driver body 145. Each blade 145 is particularly configured to have a spring portion 27 near the middle thereof so as to aid in retention of blade 145 within driver body 20 and to bias tip 22 of each blade 145 toward mid-plane 8. Stop knobs 28 are provided on each blade 145 in order to limit the inward closing of blade tips 22 upon mid-plane 8. In the 5 mm. hole spacing described above, each stop knob 28 is typically 0.085 inches in length and each blade 145 is configured such that the tips thereof can close to no less a spacing than 0.150 inches.

Outside formers 149 are configured such that blade tips 22 may be flexed outwardly past the inside surfaces of outside formers 149. After forming of a lead and during actuation of the driver 145 to engage and drive the formed lead, camming surface 14 of each outside former 149 will ensure proper engagement of a tip 22 with the formed lead while allowing maximum spreading of tips 22 and sliding engagement with the inside surfaces of outside formers 149 during insertion.

Figure 10:
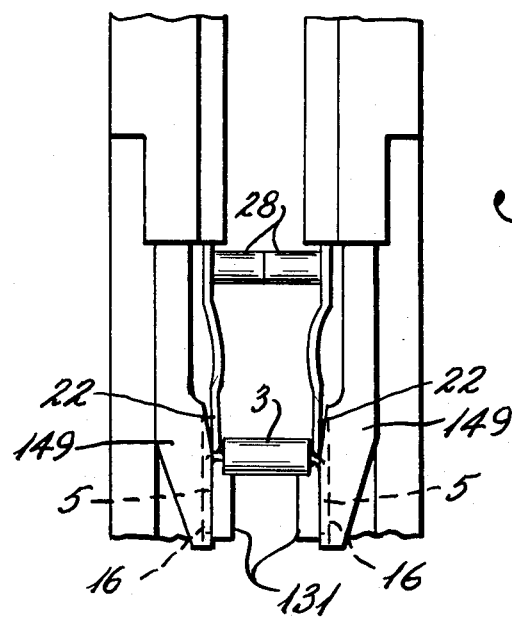

Since driver blades 145 are so close to the body 3 of the component as illustrated in FIG. 10, no inside "kick-out" of the leads by the subsequent clinching operation may occur when handling components to be inserted in such small hole spacings. However, upon attempting to insert components into larger hole spacings and wherein the component body 3 is not engaged by or very close to drivers 145 in the manner illustrated in FIG. 10, the lead misinsertion of FIG. 8 can occur with reduced thickness driver blades. Such a "kick-out" problem for larger hole spacings has been overcome by the particular configuration and mounting of the blades 145 such that, upon spreading of tooling sections 103 so that stop knobs 28 do not engage, driver blade tips 22 will be sprung inwardly away from engagement with the inside surfaces of outside formers 149. This inward springing or spacing of driver blade tips 22 from the inside surfaces of outside formers 149 causes engagement of the tips 22 with portions of the formed leads which are substantially not on the formed radius thereof. Accordingly, the driver blade tips 22 appear thicker to the formed leads, and the above described "kick-out" of a lead in the clinching operation is avoided.

While only one embodiment of the present invention has been described in detail, various modifications thereof and additions thereto will become apparent to those skilled in the art in view of the foregoing description. For example, various other means for causing the spacing between driver tips 22 and outside formers 149 may be provided to accomplish a similar result. It is conceivable that the invention could be used for "body driving" insertion into some hole spacings and that, upon spreading of the tooling for wider hole spacings, the above-described kick-out would be avoided during a lead-driving insertion. Even though "body driving" insertion often times cause damage to the component body, this combining of body driving and lead driving with the same apparatus is contemplated also. Still further, use of the invention is contemplated for insertions when hole spacings are smaller than 0.197 inches.

It will thus be seen that the objects set forth above, among those made apparent from the preceding description, are efficiently attained and, since certain changes may be made in carrying out the above method and in the construction set forth without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter language, might be said to fall therebetween.

What is claimed is:

1. A method of mounting components on circuit boards by use of at least two tool sections each on opposite sides of and being movable toward and away from a mid-plane, said components each comprising a body and leads extending in generally opposite directions from said body, said circuit boards having sets of spaced lead receiving holes with at least two sets of holes having different center-to-center hole spacings for receiving formed leads with corresponding formed lead spacings and one of said hole spacings being a smallest hole spacing, and said tool sections each comprising a lead former and a means for driving a formed lead into a corresponding hole of said spaced holes by engagement with said formed lead, the method comprising the step of:

spacing each of said driving means inwardly toward said mid-plane from an adjacent outside former a distance further than such spacing for said smallest hole spacing and sufficiently far from a radius of said formed lead, upon spreading a pair of outside formers apart from a setting for said smallest hole spacing, in order to avoid a lead misinsertion when inserting and driving formed leads into a set of holes having spacings greater than said smallest hole spacing, said misinsertion being causable by forcing a formed lead from driving engagement with a blade of said driving means during a subsequent operation of clinching inserted leads to an underside of said circuit board.

2. A method as in claim 1, and further comprising the steps in preparation for said driving of:

closing each of said tool sections toward said mid-plane to accommodate the mounting of components on said circuit boards via holes having said smallest hole spacing; and moving each blade of said driving means closer to the adjacent outside former and maximizing a spacing between blades of said driving means for said smallest hole spacing.

3. A method as in claim 1, and further comprising the steps in preparation for said driving of:

opening each blade of said driving means relative to said mid-plane and toward said adjacent outside former and closing each outside former toward said mid-plane; and forming and inserting the leads of a component into circuit board holes having said smallest spacing.

4. A method as in claim 3, and further comprising the steps of:

halting the blades of said driving means relative to said mid-plane while closing said outside formers toward said mid-plane so as to maximize a body length of a component the leads of which are to be formed and inserted into holes having said smallest hole spacings.

5. In an apparatus for mounting components on circuit boards and comprising tool sections on opposite sides of an each movable toward and away from a mid-plane, said components each comprising a body and leads extending in generally opposite directions from said body, said circuit boards having sets of spaced lead receiving holes with at least two sets of holes having different center-to-center hole spacings for receiving formed leads of components having corresponding formed lead spacings and one of said hole spacings being a smallest hole spacing, and said tool sections each comprising a lead former and a means for driving a formed lead into a corresponding hole of said spaced holes, each said driving means being operatively associated with a lead former, the improvement comprising:

means, operatively associated with said driving means, for spacing blades of said driving means inwardly toward said mid-plane from adjacent outside formers a distance further than such spacing for said smallest hole spacing and sufficiently far from radii of said formed leads upon spreading a pair of outside formers apart from a setting for said smallest hole spacing in order to avoid a lead misinsertion when mounting a component by driving said formed leads into a set of holes having spacings greater than said smallest hole spacing, said misinsertion being causable by forcing a formed lead from driving engagement with a blade of said driving means during an operation of clinching inserted leads to an underside of said circuit board.

6. An improvement as in claim 5, and further comprising:

means, operatively associated with said driving means, for opening each blade of said driving means relative to said mid-plane and toward an adjacent outside former and closing each outside former toward said mid-plane in order to form and insert leads of a component into circuit board holes having said smallest spacing.

7. An improvement as in claim 6, and further comprising:

means, operatively associated with said blades, for halting the blades of said driving means relative to said mid-plane while closing said outside formers toward said mid-plane so as to maximize a body length of a component of which the leads are to be formed and inserted into holes having said smallest hole spacings.

8. An improvement as in claim 5, wherein said spacing means comprises:

means for mounting said blades flexibly on drivers, operatively associated with said outside formers and reciprocatable in a direction generally parallel to said mid-plane and relative to said outside formers, such that said spacing between each blade and an adjacent outside former is automatically provided.

9. An improvement as in claim 8, said drivers and said blades further comprising means for removably mounting said blades on said drivers.

10. An improvement as in claim 8, said blades comprising:

a flexible material configured to lock into grooves in said drivers.

11. An improvement as in claim 7, wherein said halting means comprises:

a knob on each of said blades such that said blades are limited in closing by engagement of the knobs of said blades with each other.

12. An improvement as in claim 7, and further comprising:

tips of said blades; and means, operatively associated with said tips, for engaging and camming said tips toward said mid-plane during said driving so as to slidingly engage and pass said outside formers during insertion of said leads into said holes with said smallest spacing.

* * * * *